(12) United States Patent
Lee et al.

(10) Patent No.: US 6,498,092 B2
(45) Date of Patent: Dec. 24, 2002

(54) METHOD OF MAKING A SEMICONDUCTOR DEVICE HAVING DUAL DAMASCENE LINE STRUCTURE USING A PATTERNED ETCHING STOPPER

(75) Inventors: Kyung-tae Lee, Kwacheon (KR); Seong-ho Liu, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/780,830

(22) Filed: Feb. 9, 2001

(65) Prior Publication Data

US 2002/0030280 A1 Mar. 14, 2002

(30) Foreign Application Priority Data

Jul. 25, 2000 (KR) .............................................. 00-42750

(51) Int. Cl.⁷ .......................................... H01L 21/4763
(52) U.S. Cl. ........................ 438/634; 438/637; 438/638; 438/666; 438/687
(58) Field of Search ................................ 438/634, 637, 438/638, 666, 687

(56) References Cited

U.S. PATENT DOCUMENTS

| | | | | |
|---|---|---|---|---|
| 5,795,823 A | | 8/1998 | Avanzino et al. ............ | 438/639 |
| 5,976,972 A | * | 11/1999 | Inohara et al. ............... | 438/640 |
| 6,093,632 A | * | 7/2000 | Lin .............................. | 438/618 |
| 6,133,144 A | * | 10/2000 | Tsai et al. .................... | 438/634 |
| 6,180,514 B1 | * | 1/2001 | Yeh et al. .................... | 438/633 |
| 6,265,780 B1 | * | 7/2001 | Yew et al. ................... | 257/759 |
| 6,331,479 B1 | * | 12/2001 | Li et al. ...................... | 438/618 |
| 2002/0030280 A1 | * | 3/2002 | Lee et al. .................... | 257/774 |

* cited by examiner

Primary Examiner—Richard Booth
Assistant Examiner—Lynne A. Gurley
(74) Attorney, Agent, or Firm—Mills & Onello, LLP

(57) ABSTRACT

A semiconductor device having a dual damascene line structure and a method for fabricating the same are disclosed. The semiconductor device and the method solve the conventional problem of a partially, or fully, closed contact hole, and restrain increase in the parasitic capacitance in an interlayer insulation layer due to an increase in the dielectric constant thereof through the use of an etching stopper layer. To achieve this, a first interlayer insulation layer is formed on a semiconductor substrate on which a first conductive pattern is formed. Next, the etching stopper pattern having an etching selection ratio with respect to the first interlayer insulation layer is partially formed in a particular area. Thereafter, a second interlayer insulation layer and a second conductive layer made of copper are formed.

23 Claims, 9 Drawing Sheets

METHOD OF MAKING A SEMICONDUCTOR DEVICE HAVING DUAL DAMASCENE LINE STRUCTURE USING A PATTERNED ETCHING STOPPER

BACKGROUND OF THE INVENTION

1. Field of the Invention

The present invention relates to a semiconductor device and a method for fabricating the same, and more particularly, to a semiconductor device having a dual damascene line structure and a method for fabricating the same.

2. Description of the Related Art

A damascene or inlay technique is an old technique for ornamenting craftworks. In this technique, various patterns are engraved on the surface of metal, ceramics or wood, and then a different material such as gold, silver or mother-of-pearl is inserted into the engraved portion.

Such a damascene technique has lately attracted attention as a new method of forming a metal line during the fabrication of semiconductor devices. In particular, since IBM Corporation announced that they applied a copper wiring process using a dual damascene technique to the fabrication of semiconductor devices in 1997, a variety of research has been carried out on the copper wiring process using the damascene technique focusing on logic devices.

Generally, it is difficult to dry-etch a copper line since the vapor pressure of by-products is low during a dry etching process, and the copper line is especially subject to corrosion such that it is difficult to use the copper line for a metal line in a semiconductor device.

However, the formation of a copper line becomes possible by using the damascene technique and a chemical mechanical polishing (CMP) process, instead of using dry-etching. Usually, a copper line has lower resistance than other existing metal lines and excellent electro-migration properties. In addition, a copper line allows the number of steps of forming a metal line in a semiconductor device to be reduced so that the fabrication cost can be reduced.

FIGS. 1 and 2 are sectional views illustrating conventional methods of forming a dual damascene line in a semiconductor device.

Referring to FIG. 1, a first conductive pattern 30 is formed on a semiconductor substrate 10, and then a first interlayer insulation layer 20 is formed. A second interlayer insulation layer 40 is formed on the first interlayer insulation layer 20. Subsequently, photolithography is performed to form a second interlayer insulation layer 40 pattern exposing a portion of the first interlayer insulation layer 20. Finally, a photoresist pattern 50 is formed on the semiconductor substrate 10 having the second interlayer insulation layer 40 pattern, and then an etching process is performed, thereby forming via contact holes 60 exposing the first conductive pattern 30.

However, in the conventional method of forming a damascene line in a semiconductor device described above, when an aspect ratio is large during dry etching for forming a via contact hole, the bottom of the via contact hole is not completely opened (70) due to the influence of a resulting etching slope and by-products. This problem becomes more severe as the integration density of semiconductor devices increases. To solve this problem, an etching stopper layer is provided between the first interlayer insulation layer and the second interlayer insulation layer.

Referring to FIG. 2, a first conductive pattern 31, a first interlayer insulation layer 21, a second interlayer insulation layer 41 and a photoresist pattern 51 are formed on a semiconductor substrate 11 in the same manner as used in FIG. 1. An etching stopper 35 is further formed between the first interlayer insulation layer 21 and the second interlayer insulation layer 41 using a silicon nitride (SiN) layer.

This method solves the problem of the bottom of a via contact hole 61 not being opened by performing over-etching using the etching stopper 35; however, a nitride layer, i.e., the etching stopper 35, having a high dielectric constant should be formed between the interlayer insulation layers. When a material having a high dielectric constant is used between the interlayer insulation layers, parasitic capacitance in the interlayer insulation layers increases, thereby increasing RC delay during operation of the semiconductor device.

SUMMARY OF THE INVENTION

To address the above limitations, it is an object of the present invention to provide a semiconductor device having a dual damascene line structure that solves the aforementioned problem of the bottom of a via contact hole not being opened by using an etching stopper, and for reducing the parasitic capacitance of an interlayer insulation layer.

It is another object of the present invention to provide a method for fabricating a semiconductor device having the dual damascene line structure.

Accordingly, to achieve the first object of the invention, there is provided a semiconductor device having a dual damascene line structure. The semiconductor device includes a semiconductor substrate, a first conductive pattern formed on the semiconductor substrate, a first interlayer insulation layer covering the top of the first conductive pattern, an etching stopper pattern locally formed on the first interlayer insulation layer, a via contact plug formed within the first interlayer insulation layer in an area where the etching stopper pattern is formed such that the via contact plug is connected to the first conductive pattern, a second interlayer insulation layer formed on the etching stopper pattern, and a metal contact plug formed within the second interlayer insulation layer in an area where the etching stopper pattern is formed, wherein a portion of the etching stopper pattern is etched, and thus the metal contact plug is connected to the via contact plug.

The area of the locally formed etching stopper pattern is preferably wider than the area of the bottom of the metal contact plug.

To achieve the second object of the invention, in one embodiment, there is provided a method for fabricating a semiconductor device having a dual damascene line structure. In the method, a first interlayer insulation layer is formed on a semiconductor substrate on which a first conductive pattern has been formed. An etching stopper is formed on the first interlayer insulation layer. An etching stopper pattern is formed by patterning the etching stopper. A second interlayer insulation layer is deposited on the semiconductor substrate on which the etching stopper pattern has been formed. The second interlayer insulation layer is patterned, thereby forming a first metal trench exposing the etching stopper pattern and a second metal trench where, as well as the second interlayer insulation layer, a portion of the first interlayer insulation layer is etched. Photolithography is performed on the semiconductor substrate, thereby forming a via contact hole exposing the first conductive pattern in an area corresponding to the first metal trench. A second conductive layer is formed to cover the surface of the semiconductor substrate so that the second conductive layer fills the first metal trench, the second metal trench and the via contact hole. The second conductive layer may be planarized using a chemical mechanical polishing method.

In another embodiment, there is provided a method for fabricating a semiconductor device having a dual damascene line structure. In this method, a first interlayer insulation layer is formed on a semiconductor substrate on which a first conductive pattern has been formed. An etching stopper is formed on the first interlayer insulation layer. An etching stopper pattern is formed by patterning the etching stopper. A second interlayer insulation layer is deposited on the semiconductor substrate on which the etching stopper pattern has been formed. Photolithography is performed on the semiconductor substrate, thereby forming a via contact hole exposing the first conductive pattern. The second interlayer insulation layer is patterned, thereby forming a first metal trench exposing the etching stopper pattern and a second metal trench where, as well as the second interlayer insulation layer, a portion of the first interlayer insulation layer is etched. A second conductive layer is formed to cover the surface of the semiconductor substrate so that the second conductive layer fills the first metal trench, the second metal trench and the via contact hole. The second conductive layer is optionally planarized by a chemical mechanical polishing method.

In still another embodiment, there is provided a method for fabricating a semiconductor device having a dual damascene line structure. In this method, a first interlayer insulation layer is formed on a semiconductor substrate on which a first conductive pattern has been formed. An etching stopper is formed on the first interlayer insulation layer. First etching stopper patterns are formed by patterning the etching stopper. Photolithography is performed on one of the first etching stopper patterns, thereby forming a second etching stopper pattern allowing a via contact hole to be formed in a self-aligning manner in a later step. A second interlayer insulation layer is deposited on the semiconductor substrate on which the second etching stopper pattern has been formed. Photolithography is performed on the second interlayer insulation layer, thereby forming a first metal trench exposing the second etching stopper pattern and thus forming a self-aligned via contact hole exposing the first conductive pattern, and forming a second metal trench where etching is stopped by another first etching stopper pattern. A second conductive layer is formed to cover the surface of the semiconductor substrate so that the second conductive layer fills the first metal trench, the second metal trench and the via contact hole. The second conductive layer is optionally planarized by a chemical mechanical polishing method.

The second conductive layer is preferably formed of copper. The etching stopper may be formed of a material having a lower etching rate than the first interlayer insulation layer and is preferably formed of a material selected from the group consisting of SiN, SiC and $SiO_2$. The etching stopper pattern may be wider than the first metal trench.

The method preferably further includes the step of forming a layer for improving adhesion or preventing diffusion in the first metal trench, the second metal trench and the via contact hole, before depositing the second conductive layer.

According to the present invention, by locally using an etching stopper pattern in a particular region, the problem of the bottom of a via contact hole being partially opened, or blocked, following its formation, through etching, is solved. In addition, an increase in the dielectric constant of an interlayer insulation layer is restrained due to localized formation, thereby minimizing increase in the parasitic capacitance of the interlayer insulation layer.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF PREFERRED EMBODIMENTS

Figure 1:
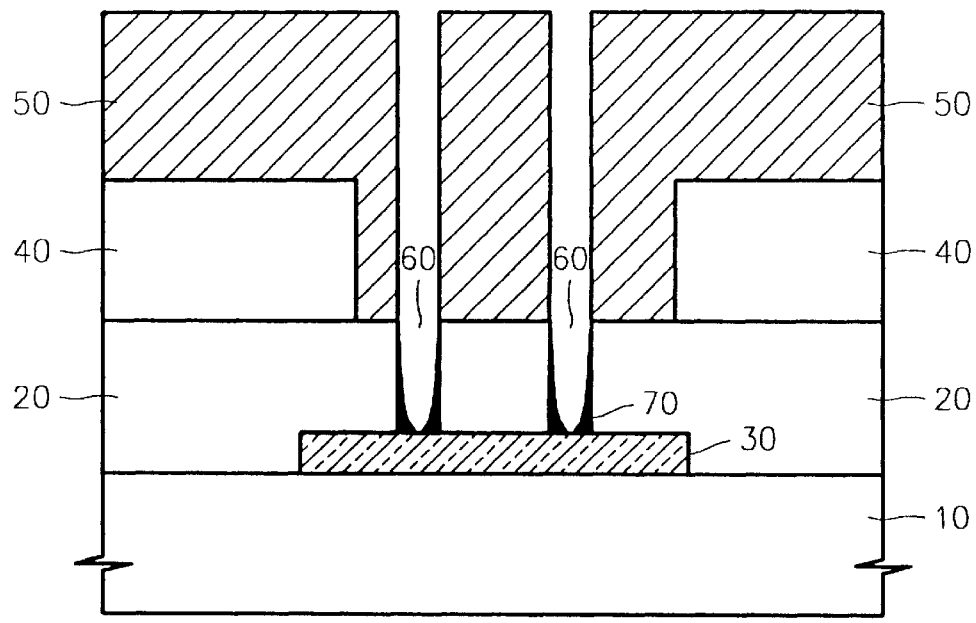
FIGS. 1 and 2 are sectional views illustrating conventional methods of forming a dual damascene line in a semiconductor device.
Figure 2:
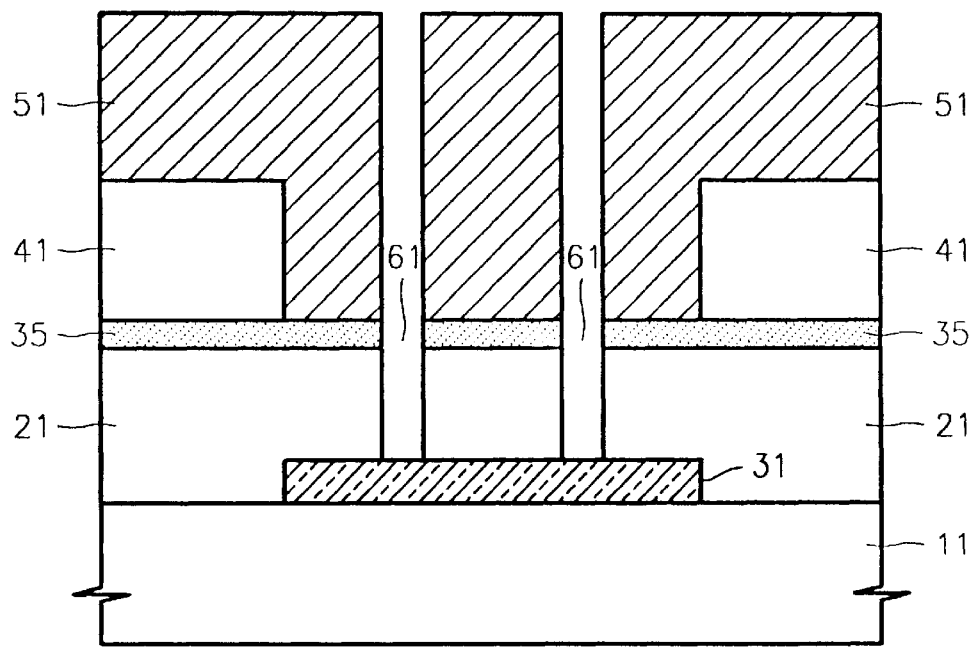

Hereinafter, preferred embodiments of the present invention will be described in detail with reference to the attached drawings.

Firstly, a semiconductor device having a dual damascene line structure according to the present invention will be fully described with reference to FIG. 8. The semiconductor device includes a semiconductor substrate 100, a first conductive pattern 102 formed on the semiconductor substrate 100, a first interlayer insulation layer 104 covering the surface of the first conductive pattern 102, an etching stopper pattern 106 locally formed on the first interlayer insulation layer 104, a via contact plug 122 formed in the area of the first interlayer insulation layer 104 corresponding to the etching stopper pattern 106 and connecting to the first conductive pattern 102, a second interlayer insulation layer 108 formed on the etching stopper pattern 106 and the first interlayer insulation layer 104, and a metal contact plug 114' formed in the area of the second interlayer insulation layer 108 corresponding to the etching stopper layer pattern 106 by etching a portion of the etching stopper pattern 106 and connecting to the via contact plug 122.

In the configuration of a semiconductor device having such a dual damascene line structure, the etching stopper pattern 106 is important toward achieving the objectives of the present invention. Since the etching stopper pattern 106 is used as an etching stopper when etching is performed to form a via contact hole for forming the via contact plug 122, the problem of a closed via contact hole bottom can be solved.

In addition, the etching stopper pattern 106 is formed to have a width that is 0.05 µm larger than the width of the bottom of a metal trench for forming the metal contact plug 114'. Accordingly, the etching stopper pattern 106 is locally formed only in a particular area, that is, localized to an area where the metal trench and the via contact hole are formed. Therefore, any increase in parasitic capacitance due to material having a high dielectric constant used between interlayer insulation layers is mitigated.

A method for fabricating a semiconductor device having a dual damascene line structure according to the present invention will be described by explaining three embodiments.

First Embodiment: Case of Forming a Trench First in Forming a Dual Damascene Line FIGS. 3 through 8 are sectional views illustrating a method of forming a dual damascene line in a semiconductor device according to a first embodiment of the present invention.

Figure 3:
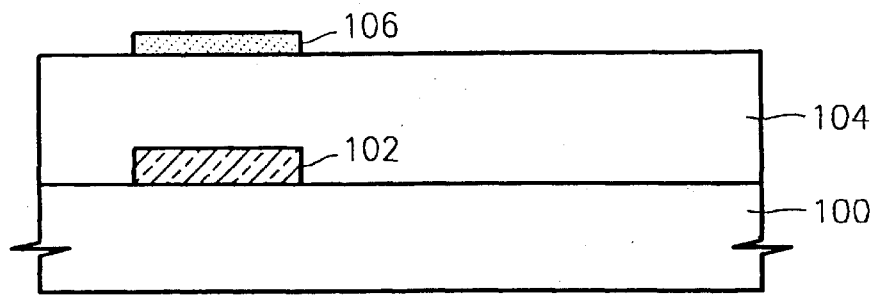
FIGS. 3 through 8 are sectional views illustrating a method of forming a dual damascene line in a semiconductor device according to a first embodiment of the present invention.

Referring to FIG. 3, a first interlayer insulation layer 104 is formed on a semiconductor substrate 100 on which a first conductive pattern 102 is formed. The first interlayer insulation layer 104 is preferably an oxide-based insulation layer. Subsequently, an etching stopper is formed on the first interlayer insulation layer 104 to a thickness of 500–1000 Å. The etching stopper is preferably an insulation layer having a lower etching rate than the first interlayer insulation layer 104. The etching stopper is preferably formed of SiN, SiC or $SiO_2$.

Thereafter, photolithography is performed on the etching stopper to locally form an etching stopper pattern 106 in a particular area. The area where the etching stopper pattern 106 is formed corresponds to an area where a first metal trench and a via contact hole will be formed in subsequent processes.

Figure 4:
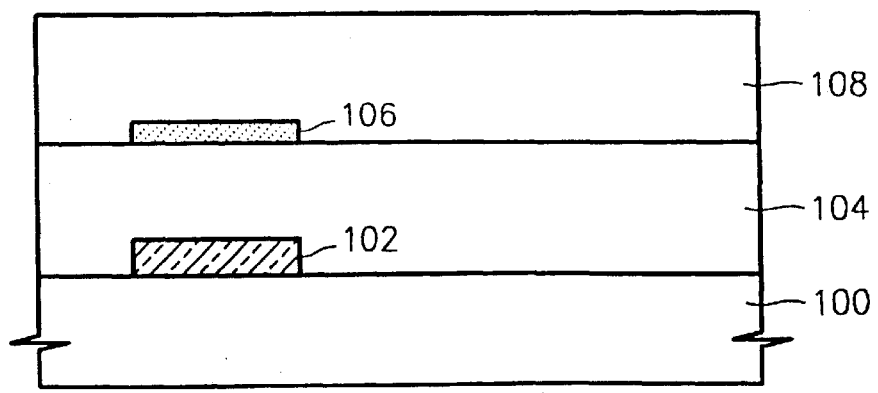

Referring to FIG. 4, a second interlayer insulation layer 108 is formed on the semiconductor substrate 100 having the etching stopper pattern 106, to an adequate thickness. The second interlayer insulation layer 108 is preferably formed of an oxide-based material having an etching rate similar to, or equal to, that of the first interlayer insulation layer 104.

Figure 5:
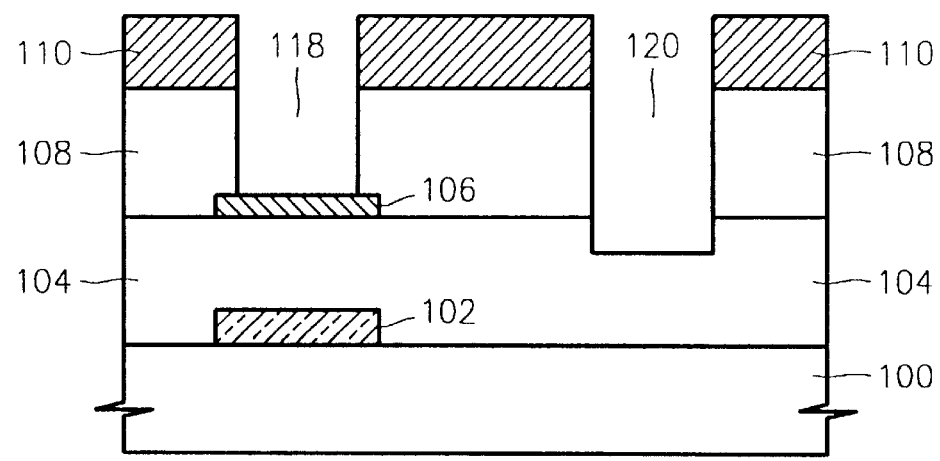

Referring to FIG. 5, a photoresist pattern 110 is formed on the second interlayer insulation layer 108, and then etching is performed. The etching is stopped by the etching stopper pattern 106 in the area where a first metal trench 118 is formed, but the second interlayer insulation layer 108 and a portion of the first interlayer insulation layer 104 are etched in an area where a second metal trench 120 is formed without the etching stopper pattern 106.

In this case, the etching stopper pattern 106 for stopping etching in the area of the first metal trench 118 functions properly only when the width of the etching stopper pattern 106 is larger than the width of the first metal-trench 118. To preferably reduce the width of the etching stopper pattern 106 having a high dielectric constant, the width of the etching stopper pattern 106 is preferably on the order of, for example, 0.05 μm larger than that of the first metal trench 118.

Figure 6:
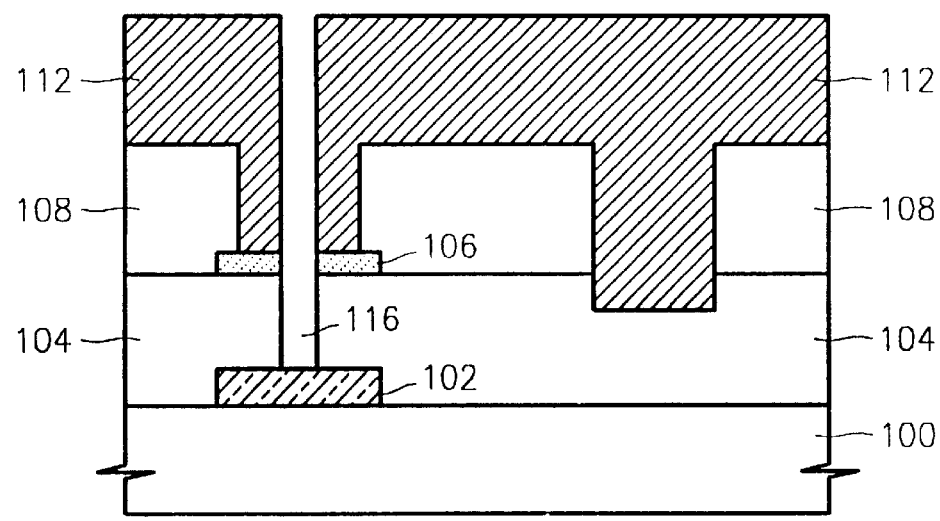

Referring to FIG. 6, the photoresist pattern 110 is removed, and another photoresist pattern 112 is formed. A via contact hole 116 exposing a portion of the first conductive pattern 102 is formed using the photoresist pattern 112.

Here, since the first metal trench has already been formed using the etching stopper pattern 106, the depth at which etching for forming the via contact hole begins is lower than that in the conventional art by the depth of the first metal trench. Accordingly, the aforementioned limitation of the conventional approach in that the bottom of the via contact hole 116 may be closed due to the long depth thereof is addressed by the present invention.

Figure 7:
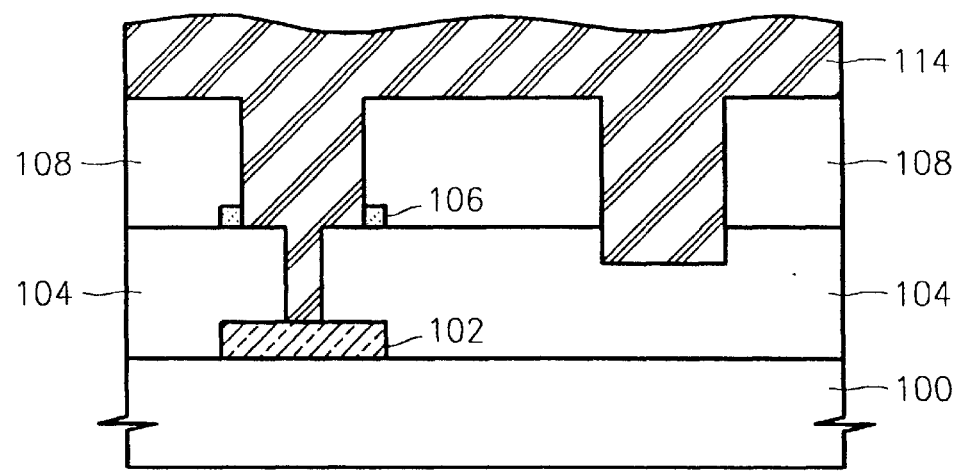

Referring to FIG. 7, the photoresist pattern 112 is removed, and the portion of the etching stopper pattern 106 exposed on the bottom of the first metal trench is removed by wet etching. Thereafter, a layer (not shown) for restraining diffusion or increasing an adhesive strength between oxide-based layers such as the first interlayer insulation layer 104 and the second interlayer insulation layer 108, which are exposed along the surface of the semiconductor substrate 100, and a copper line formed in a later process, may be formed on the semiconductor substrate 100 by a blanket method. This layer may be a single layer formed of TiN, Ta or TaN or a multilayer including one of these.

Thereafter, a first conductive layer 114 such as a copper layer is formed adequately on the semiconductor substrate 100 so that it fills the via contact hole and the first and the second metal trenches. The copper layer is formed by forming a copper seed layer using a physical vapor deposition method or a chemical vapor deposition method and performing electroplating on the seed layer. Accordingly, the formation of voids in the via contact hole, the first metal trench and the second metal trench can be restricted, and fabrication time can be reduced.

Figure 8:
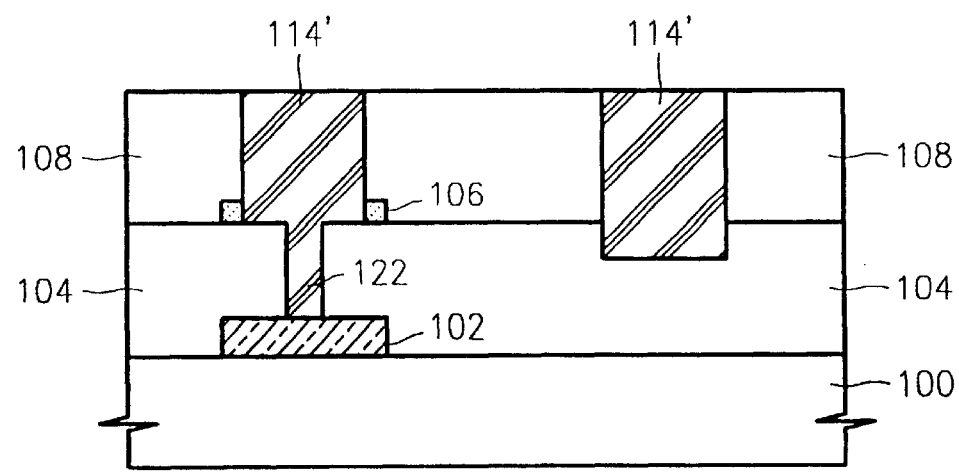

Referring to FIG. 8, the surface of the semiconductor substrate 100 having the first conductive layer 114 formed of copper is etched back by chemical mechanical polishing, thereby exposing the surface of the second interlayer insulation layer 108. As a result, a second conductive pattern in the form of metal contact plugs 114' is formed. Therefore, the second conductive pattern in the form of metal contact plugs 114' in the area where the first metal trench is formed, that is, in the area where the via contact hole is connected, is thinner than the thickness of the second conductive pattern in the form of metal contact plugs 114' in the area where the second metal trench is formed.

Second Embodiment: Case of Forming a Via Contact Hole First in Forming a Dual Damascene Line In the second embodiment, the order of the steps in the first embodiment is modified. Descriptions of the second embodiment that are the same as the first embodiment will be omitted. FIGS. 9 through 13 are sectional views illustrating a method of forming a dual damascene line in a semiconductor device according to the second embodiment of the present invention.

Figure 9:
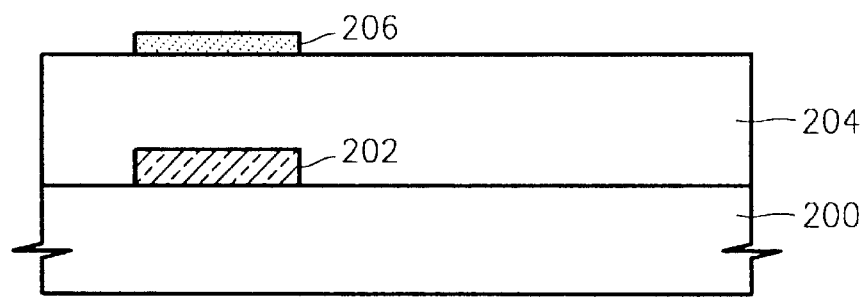
FIGS. 9 through 13 are sectional views illustrating a method of forming a dual damascene line in a semiconductor device according to a second embodiment of the present invention.

Referring to FIG. 9, a first conductive pattern 202 is formed on a semiconductor substrate 200, and then a first interlayer insulation layer 204 is formed. An etching stopper pattern 206 is formed of SiN, SiC or $SiO_2$ on the first interlayer insulation layer 204.

Figure 10:
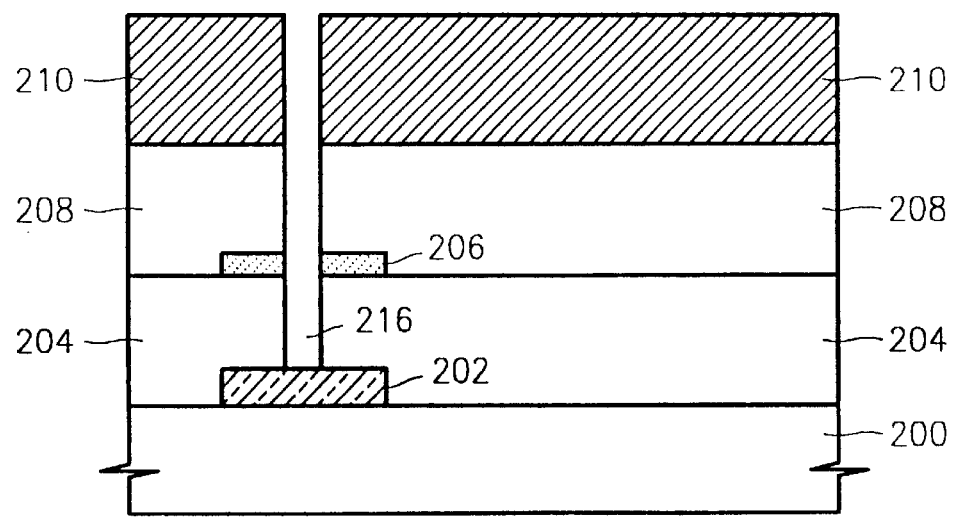

Referring to FIG. 10, a second interlayer insulation layer 208 is formed on the semiconductor substrate 200 having the etching stopper pattern 206. Thereafter, a photoresist pattern 210 is formed, and then etching is performed, thereby forming a via contact hole 216 exposing a portion of the first conductive pattern 202.

Figure 11:
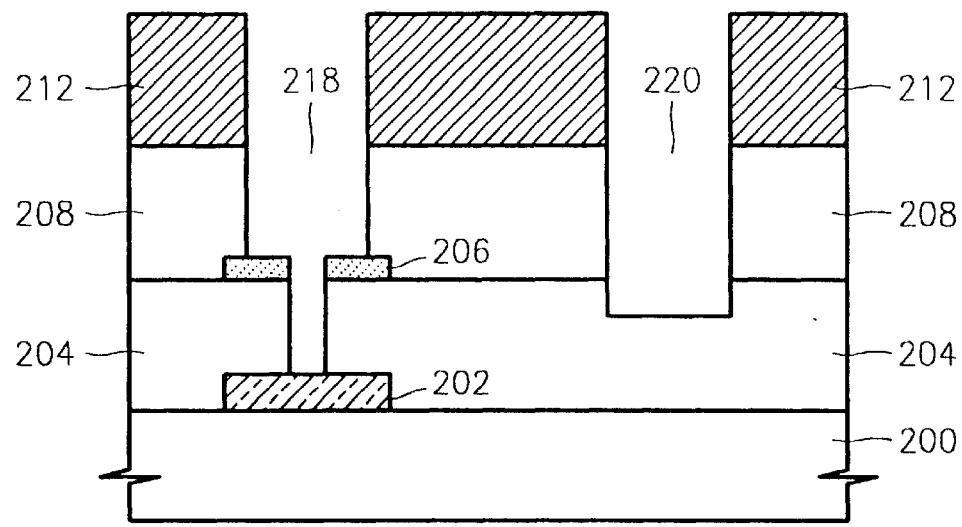

Referring to FIG. 11, the photoresist pattern 210 is removed, and then another photoresist pattern 212 used for forming a first metal trench 218 and a second metal trench 220 is formed on the second interlayer insulation layer 208. Subsequently, the underlying layers are etched using the photoresist pattern 212.

Here, in an area where the first metal trench 218 is formed, the etching is stopped before the first interlayer insulation layer 204 by the etching stopper pattern 206 formed in a particular area according to the present invention. However, in an area where the second metal trench 220 is formed, the etching is continued into a portion of the first interlayer insulation layer 204 because an etching stopper pattern does not exist in that region.

Figure 12:
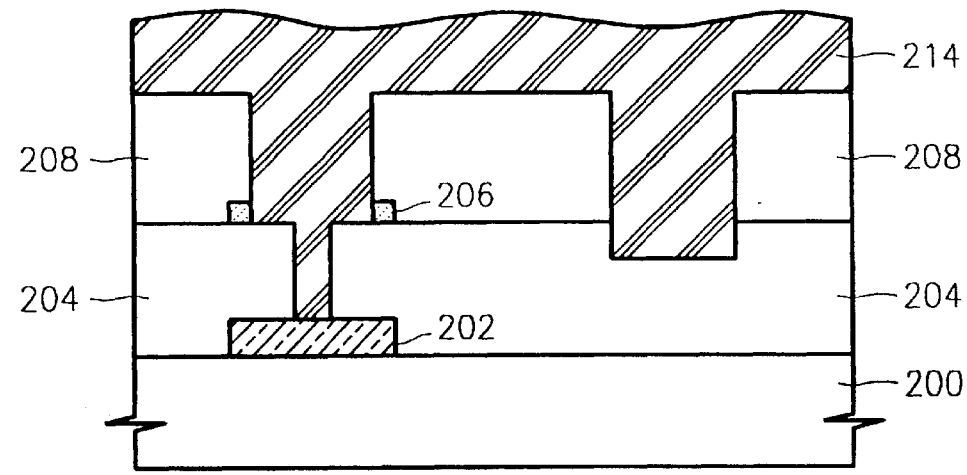

Referring to FIG. 12, the photoresist pattern 212 is removed, and then the portion of the etching stopper pattern 206 exposed in the area of the first metal trench 218 is removed by dry etching. A layer (not shown) for improving the adhesive strength or preventing diffusion may be formed on the exposed surface of the semiconductor substrate 200 by a blanket method. Thereafter, a copper layer corresponding to a first conductive layer 214 is formed on the entire surface of the semiconductor substrate 200 so that it fills the via contact hole, the first metal trench and the second metal trench.

Figure 13:
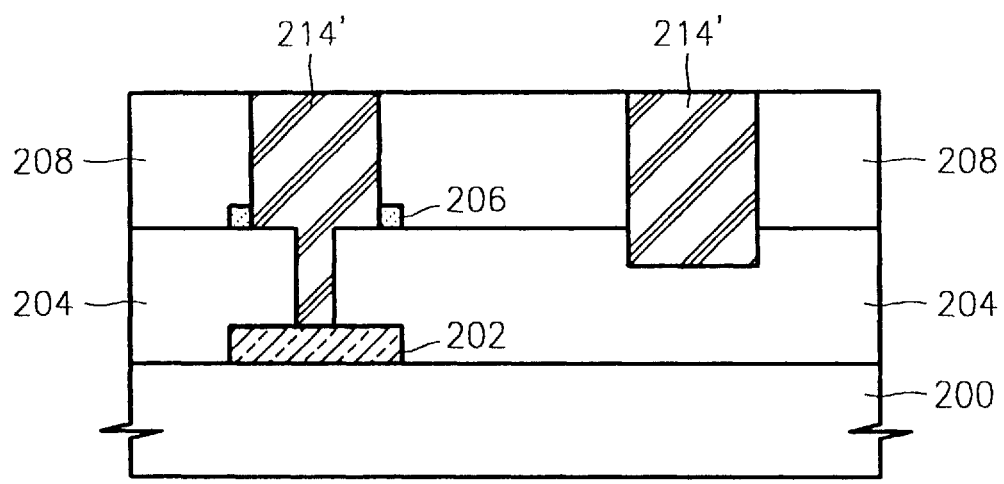

Referring to FIG. 13, a chemical mechanical polishing process is performed on the semiconductor substrate 200 having the first conductive layer 214 until the surface of the second interlayer insulation layer 208 is exposed. As a result, second conductive patterns 214' are formed in the first and the second metal trenches.

Third Embodiment: Case of Forming a Via Contact Hole in a Self-Aligning Manner in Forming a Dual Damascene Line In a third embodiment, the order of the steps for forming a via contact hole in the first embodiment is modified. Descriptions of the third embodiment that are the same as the first embodiment will be omitted. FIGS. 14 through 18 are sectional views illustrating a method of forming a dual damascene line in a semiconductor device according to the third embodiment of the present invention.

Figure 14:
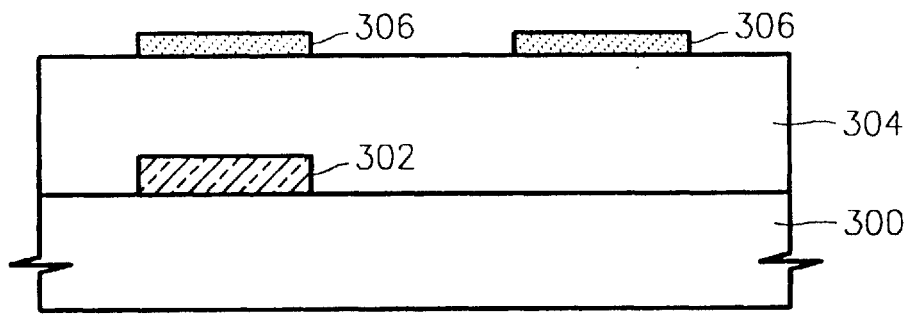
FIGS. 14 through 18 are sectional views illustrating a method of forming a dual damascene line in a semiconductor device according to a third embodiment of the present invention.

Referring to FIG. 14, a first conductive pattern 302 is formed on a semiconductor substrate 300, and then a first interlayer insulation layer 304 is formed. A first etching stopper pattern 306 is formed of SiN, SiC or $SiO_2$ on the first interlayer insulation layer 304. Unlike the first and second embodiments, the first etching stopper pattern 306 is formed not only in an area where a first metal trench will be formed, but also in an area where a second metal trench will be formed.

Figure 15:
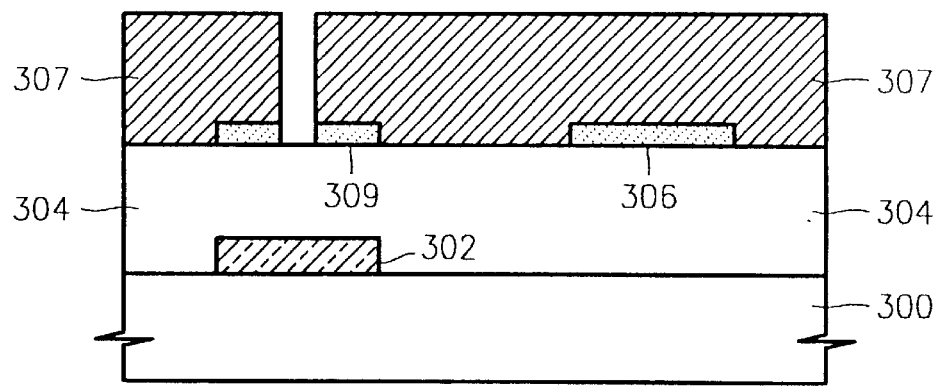
Figure 16:
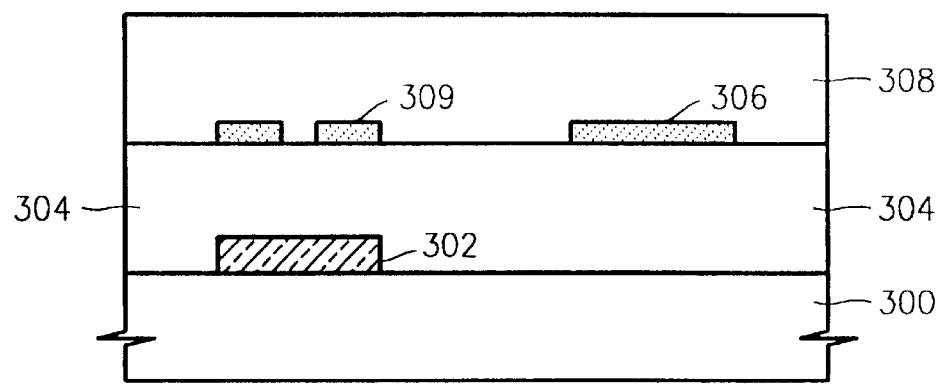

Referring to FIGS. 15 and 16, the first etching stopper pattern 306 formed in the area where the first metal trench will be formed is patterned using a photoresist pattern 307, so as to form a first etching stopper pattern 306 and a second etching stopper pattern 309. A via contact hole is formed in the second etching stopper pattern 309, as shown. A second interlayer insulation layer 308 is formed on the semiconductor substrate 300 having the first and second etching stopper patterns 306, 309.

Figure 17:
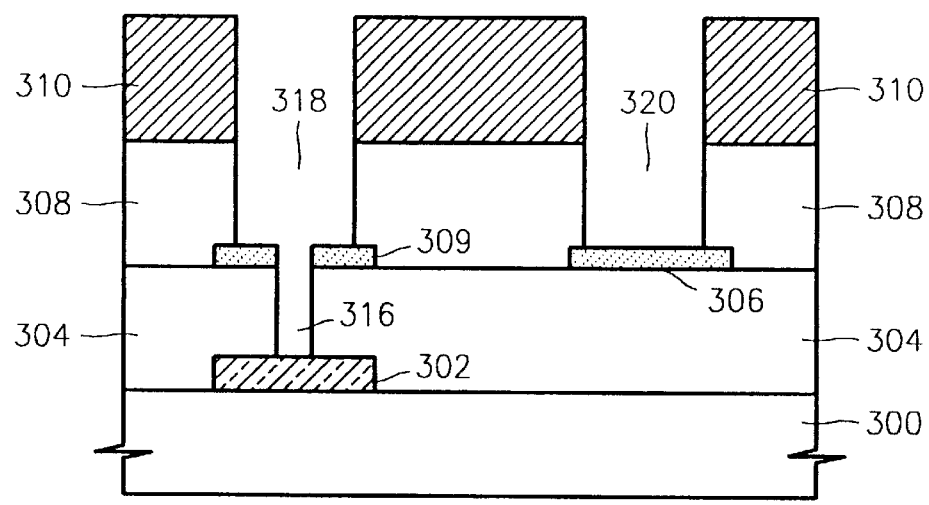

Referring to FIG. 17, another photoresist pattern 310 is formed on the semiconductor substrate 300 having the second interlayer insulation layer 308, and then etching is performed to form a first metal trench 318 and a second metal trench 320. Here, in the area of the first metal trench 318, self-aligned etching is continued due to the shape of the second etching stopper pattern 309 after the etching of the second interlayer insulation layer 308 is completed.

Progress of the self-aligned etching due to the opening in the second etching stopper pattern 309 forms a via contact hole 316, thereby exposing a portion of the surface of the first conductive pattern 302. Meanwhile, in the area of the second metal trench 320, the etching is stopped by the first etching stopper pattern 306 so that the underlying first interlayer insulation layer 304 is not etched.

Figure 18:
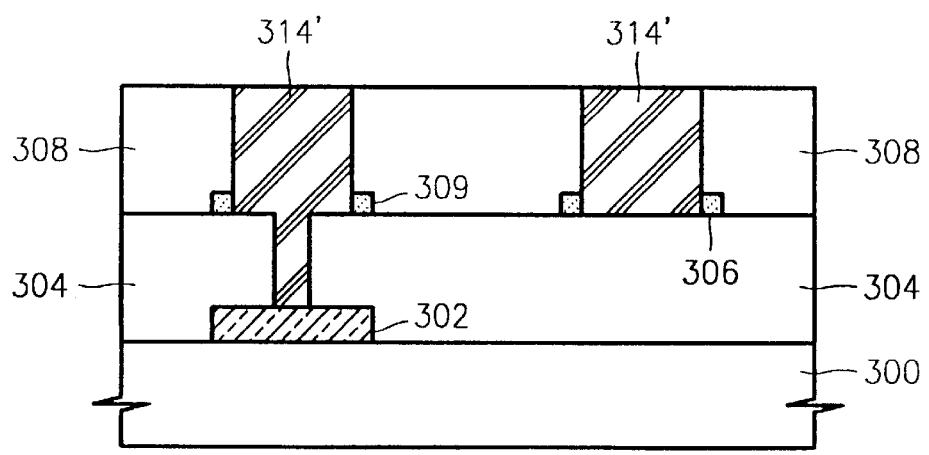

Referring to FIG. 18, the photoresist pattern 310 is removed, and the portions metal trenches 320 and 318 are removed. Subsequently, a layer (not shown) for improving the adhesive strength and/or preventing diffusion is formed within the first and second metal trenches by a blanket method.

Thereafter, a second conductive layer is formed of copper on the resultant structure. The second conductive layer fills the via contact hole, the first metal trench and the second metal trench. Finally, a chemical mechanical polishing process is performed on the second conductive layer to expose the surface of the second interlayer insulation layer 308, thereby forming second conductive patterns 314'.

Accordingly, by locally using an etching stopper pattern in a particular area, the present invention addresses the limitation of the bottom of a via contact hole being partially, or fully, closed following formation of the via contact hole through etching. In addition, through localization of the etching stopper pattern, the present invention mitigates an increase in the dielectric constant of an interlayer insulation layer arising from the etching stopper pattern, thereby minimizing an increase in the parasitic capacitance of the interlayer insulation layer.

Although the invention has been described with reference to particular embodiments, it will be apparent to one of ordinary skill in the art that modifications of the described embodiments may be made without departing from the spirit and scope of the invention.

What is claimed is:

1. A method for fabricating a semiconductor device having a dual damascene line structure, the method comprising the steps of:

forming a first interlayer insulation layer on a semiconductor substrate on which a first conductive pattern has been formed;

forming an etching stopper on the first interlayer insulation layer;

forming an etching stopper pattern above the first conductive pattern by patterning the etching stopper, the etching stopper pattern remaining after patterning being localized to regions corresponding to the first conductive pattern;

depositing a second interlayer insulation layer on the etching stopper pattern;

patterning the second interlayer insulation layer, thereby forming a first metal trench exposing the etching stopper pattern, and thereby forming a second metal trench formed through the second interlayer insulation layer and a portion of the first interlayer insulation layer;

providing a via contact hole exposing the first conductive pattern in an area corresponding to the first metal trench; and forming a second conductive layer in the first metal trench, the second metal trench and the via contact hole.

2. The method of claim 1, wherein the second conductive layer is formed of copper.

3. The method of claim 1, wherein the etching stopper is formed of a material having a lower etching rate than the first interlayer insulation layer.

4. The method of claim 3, wherein the material having the lower etching rate than the first interlayer insulation layer comprises an insulation layer formed of a material selected from the group consisting of SiN, SiC and $SiO_2$.

5. The method of claim 1, wherein the thickness of the etching stopper pattern is 500–1000 Å.

6. The method of claim 1, wherein the etching stopper pattern is wider than the first metal trench.

7. The method of claim 1, further comprising the step of forming a layer for improving adhesion or preventing diffusion in the first metal trench, the second metal trench and the via contact hole, after forming the via contact hole.

8. The method of claim 1 wherein the first interlayer insulation layer is provided adjacent the first conductive pattern and semiconductor substrate.

9. A method for fabricating a semiconductor device having a dual damascene line structure, the method comprising the steps of:

forming a first interlayer insulation layer on a semiconductor substrate on which a first conductive pattern has been formed;

forming an etching stopper on the first interlayer insulation layer;

forming an etching stopper pattern above the first conductive pattern by patterning the etching stopper, the etching stopper pattern remaining after patterning being localized to regions corresponding to the first conductive pattern;

depositing a second interlayer insulation layer on the etching stopper pattern;

providing a via contact hole through the second interlayer insulation layer, the etching stopper pattern, and the first interlayer insulation layer, thereby exposing the first conductive pattern;

patterning the second interlayer insulation layer, thereby forming a first metal trench exposing the etching stopper pattern, and thereby forming a second metal trench formed through the second interlayer insulation layer and a portion of the first interlayer insulation layer; and forming a second conductive layer in the first metal trench, the second metal trench and the via contact hole.

10. The method of claim 9, wherein the second conductive layer is formed of copper.

11. The method of claim 9, wherein the etching stopper is formed of a material having a lower etching rate than the first interlayer insulation layer.

12. The method of claim 11, wherein the material having the lower etching rate than the first interlayer insulation layer comprises an insulation layer formed of a material selected from the group consisting of SiN, SiC and $SiO_2$.

13. The method of claim 9, wherein the thickness of the etching stopper pattern is 500–1000 Å.

14. The method of claim 9, wherein the etching stopper pattern is wider than the first metal trench.

15. The method of claim 9, further comprising the step of forming a layer for improving adhesion or preventing diffusion in the first metal trench, the second metal trench and the via contact hole, after forming the first and second metal trenches.

16. The method of claim 9, wherein the first interlayer insulation layer is provided adjacent the first conductive pattern and semiconductor substrate.

17. A method for fabricating a semiconductor device having a dual damascene line structure, the method comprising the steps of:

forming a first interlayer insulation layer on a semiconductor substrate on which a first conductive pattern has been formed, the first interlayer insulation layer being adjacent the semiconductor substrate and first conductive pattern;

forming an etching stopper on the first interlayer insulation layer;

forming first etching stopper patterns by patterning the etching stopper;

performing photolithography on at least one of the first etching stopper patterns, thereby forming a second etching stopper pattern including a self-aligning via contact hole;

depositing a second interlayer insulation layer on the first and second etching stopper patterns;

photolithographically etching a first metal trench in the second interlayer insulation layer, thereby exposing the second etching stopper pattern, thereby forming a self-aligned via contact hole exposing the first conductive pattern, and forming a second metal trench where etching is stopped by the first etching stopper pattern; and forming a second conductive layer in the first metal trench, the second metal trench, and the via contact hole.

18. The method of claim 17, wherein the second conductive layer is formed of copper.

19. The method of claim 17, wherein the etching stopper is formed of a material having a lower etching rate than the first interlayer insulation layer.

20. The method of claim 19, wherein the material having the lower etching rate than the first interlayer insulation layer comprises an insulation layer formed of a material selected from the group consisting of SiN, SiC and $SiO_2$.

21. The method of claim 17, wherein the thickness of each of the etching stopper patterns is 500–1000 Å.

22. The method of claim 17, wherein the first etching stopper pattern is wider than the first metal trench.

23. The method of claim 17, further comprising the step of forming a layer for improving adhesion or preventing diffusion in the first metal trench, the second metal trench and the via contact hole, after forming the first metal trench, the second metal trench and the via contact hole.

* * * * *